United States Patent
Balasubramaniam

(10) Patent No.: US 11,146,264 B2
(45) Date of Patent: Oct. 12, 2021

(54) ELECTRIC CIRCUIT FOR TESTING A POWER-ON RESET CIRCUIT

(71) Applicant: Robert Bosch GmbH, Stuttgart (DE)

(72) Inventor: Harish Balasubramaniam, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/971,897

(22) PCT Filed: Feb. 19, 2019

(86) PCT No.: PCT/EP2019/054096
§ 371 (c)(1),
(2) Date: Aug. 21, 2020

(87) PCT Pub. No.: WO2019/162274
PCT Pub. Date: Aug. 29, 2019

(65) Prior Publication Data
US 2021/0111716 A1   Apr. 15, 2021

(30) Foreign Application Priority Data
Feb. 26, 2018   (DE) ............... 10 2018 202 835.4

(51) Int. Cl.
*H03K 17/22* (2006.01)
*G01R 31/28* (2006.01)
(Continued)

(52) U.S. Cl.
CPC ......... *H03K 17/223* (2013.01); *G01R 31/282* (2013.01); *G06F 1/24* (2013.01); *H03K 19/20* (2013.01)

(58) Field of Classification Search
CPC .... H03K 17/223; H03K 19/20; G01R 31/282; G06F 1/24
(Continued)

(56) References Cited

U.S. PATENT DOCUMENTS 4,473,759 A * 9/1984 Mahabadi ........ G01R 19/16519
327/392
5,302,861 A   4/1994 Jelinek
(Continued)

FOREIGN PATENT DOCUMENTS

EP   1986323 A2 * 10/2008 ....... H03K 19/17764
EP   1986323 A2   10/2008

OTHER PUBLICATIONS

International Search Report for PCT/EP2019/054096, dated Apr. 29, 2019.

*Primary Examiner* — Ryan Jager
(74) *Attorney, Agent, or Firm* — Norton Rose Fulbright US LLP; Gerard Messina

(57) ABSTRACT

An electric circuit for testing a power-on reset circuit. The electric circuit including a comparator, which is configured to detect an undervoltage for an input voltage to be compared to a reference voltage and to output an output signal, a first noise filter for filtering out noise from the output signal received as a first input signal for a first time period and for outputting a first filtered output signal of a second noise filter for filtering out noise from a second input signal for a second time period, and for outputting a second filtered output signal, and a digital part having an OR gate for the logical linkage of a first filtered output signal and a second filtered output signal for the output of a power-on reset signal.

12 Claims, 3 Drawing Sheets

(51) Int. Cl.
*G06F 1/24* (2006.01)
*H03K 19/20* (2006.01)

(58) Field of Classification Search
USPC .......................................................... 327/142
See application file for complete search history.

(56) References Cited

U.S. PATENT DOCUMENTS

| | | |
|---|---|---|
| 5,450,417 A | 9/1995 | Truong et al. |
| 5,485,111 A * | 1/1996 | Tanimoto ............. H03K 17/223 327/143 |
| 6,873,193 B2 * | 3/2005 | Kinoshita .............. H03K 17/22 327/143 |
| 2004/0124894 A1 | 7/2004 | Kang et al. |
| 2010/0026357 A1 | 2/2010 | Chan et al. |
| 2015/0247893 A1 | 9/2015 | Dao et al. |
| 2020/0366277 A1 * | 11/2020 | Vinayak ................... H03K 5/24 |

* cited by examiner

ELECTRIC CIRCUIT FOR TESTING A POWER-ON RESET CIRCUIT

FIELD

The present invention relates to an electric circuit for testing a power-on reset circuit, which includes a comparator configured to detect an undervoltage for an input voltage to be compared to a reference voltage and to output an output signal.

BACKGROUND INFORMATION

Circuits for detecting power-on reset signals are generally available in the related art. For example, U.S. Pat. No. 5,450,417 describes a power-on reset circuit in which two imbalanced latches, which are also known as state-controlled flip-flops, are used for detecting the occurrence of a transient power-on reset signal during a system start. Both latches are configured so that they are set to a low voltage output when switched on. One of the latches is triggered by the transient power-on reset signal and generates a voltage output that has a high level if the power-on reset circuit is functioning properly. After the power-on reset signal has been enabled, the digital part or the digital logic of the system then simply has to read out the output state of the two latches. The presence of a high signal as well as a low signal indicates that the circuit is functioning, whereas the presence of two low signals indicates a defect in the power-on reset circuit.

Conventionally, power-on reset circuits set an application-specific integrated circuit (ASIC) to a known state in a power-on by inducing a reset of the digital part of the ASIC as long as the supply voltage has not reached a minimum specified voltage level required for the proper function of the circuit. For that reason, a power-on reset is normally used for detecting an undervoltage in the current supply. Without a proper reset, the digital part may be in an unknown state, which is undesired, however.

In the automotive field, in particular, where circuits are used for applications for autonomous driving, it is important to ensure that a power-on reset circuit operates in such a way that it detects an undervoltage in the current supply and triggers a reset so that the system is able to be transferred to a safe state.

In the described related art, the power-on reset circuit is automatically tested only once during the starting operation without support from the digital part. It is assumed that the two used latches are always functioning properly. However, it is possible that the latches have defects, which could cause the two outputs of the latches to remain at a high or a low level. The information about whether the power-on reset circuit is functioning properly is therefore lost during the startup because the outputs of the two latches indicate a high level and a low level during the startup regardless of the state of the power-on reset signal.

SUMMARY

In accordance with an example embodiment of the present invention, an electric circuit for testing a power-on reset circuit is provided, which includes a comparator developed to detect an undervoltage for an input voltage to be compared to a reference voltage and to output an output signal. The electric circuit includes a first noise filter for filtering out noise from the output signal received as a first input signal for a first time period and for outputting a first filtered output signal; a second noise filter for filtering noise from a second input signal for a second time period and for outputting a second filtered output signal; and a digital part, which has an OR gate for a logical linkage of the first filtered output signal and the second filtered output signal for the output of a power-on reset signal.

The example circuit according to the present invention has the advantage that a proper function of the power-on reset circuit is verified by testing the power-on reset path after the activation with the aid of the digital part without interfering with the normal function of the ASIC in the process.

A main advantage is that the power-on reset circuit is tested for defects in the case of unchanging high/low levels without the circuit having to be taken offline. In addition, the test is able to be periodically repeated as long as the ASIC remains switched on.

The present invention additionally uses only a single power-on reset circuit without requiring a second, redundant power-on reset circuit during the testing operation.

According to one preferred embodiment of the electric circuit in accordance with the present invention, a supply voltage or a test voltage is provided as an input voltage at the comparator. Moreover, the first filtered output signal or a test signal is advantageously provided as an input signal at the second noise filter. This ensures not only that a testing operation of the circuit is able to take place in general, but also that the individual phases of the test with regard to the first noise filter and the second noise filter are able to be tested independently of each other.

An analog circuit is preferably provided as the first noise filter and/or as the second noise filter. This offers the advantage that a simple and economical realization of the circuit according to the present invention is able to be achieved.

According to one example embodiment of the present invention, the comparator and the first noise filter are jointly provided in a component of the electric circuit. This particularly saves space within the electric circuit.

According to a further advantageous embodiment of the present invention, it is provided that the second noise filter is developed to take a configurable filter time into account. This is advantageous in particular if the filter period for the power-on reset signal is to assume a very small value.

For this purpose, the second noise filter advantageously has an input for receiving a value for the configurable filter time. This makes it possible to transfer a value desired on the user side directly to the second noise filter.

According to another advantageous embodiment of the present invention, the digital part is developed to supply the value for the configurable filter time. This is useful especially because the digital part is required anyway for the evaluation of the signals output by the noise filters, and thus is able to be used for an additional task.

According to one specific embodiment of the electric circuit, it includes a circuit for the supply of a test signal for the comparator. In addition, it is advantageously provided that the electric circuit includes a circuit for supplying a test signal for the second noise filter. This is advantageous because this makes it possible to dispense with the supply of test signals by external components or circuits, and an autonomy of the circuit according to the present invention is achieved as a result.

In an advantageous manner, the digital part is developed to supply test signals. This is useful as well because the digital part is required for the evaluation of the signals output by the noise filters and a supply of test signals is achievable by the digital part at a relatively low design effort.

According to a further embodiment, a voltage splitter for the supply of an adapted supply voltage from a supply voltage is provided in the electric circuit according to the present invention. This offers the advantage that a level applied at the supply voltage is thereby able to be adapted to the wishes of a user.

Advantageous further developments of the present invention are described herein.

BRIEF DESCRIPTION OF THE DRAWINGS

Exemplary embodiments of the present invention are described in greater detail based on the figures and the description below.

DETAILED DESCRIPTION OF EXAMPLE EMBODIMENTS

Figure 1:
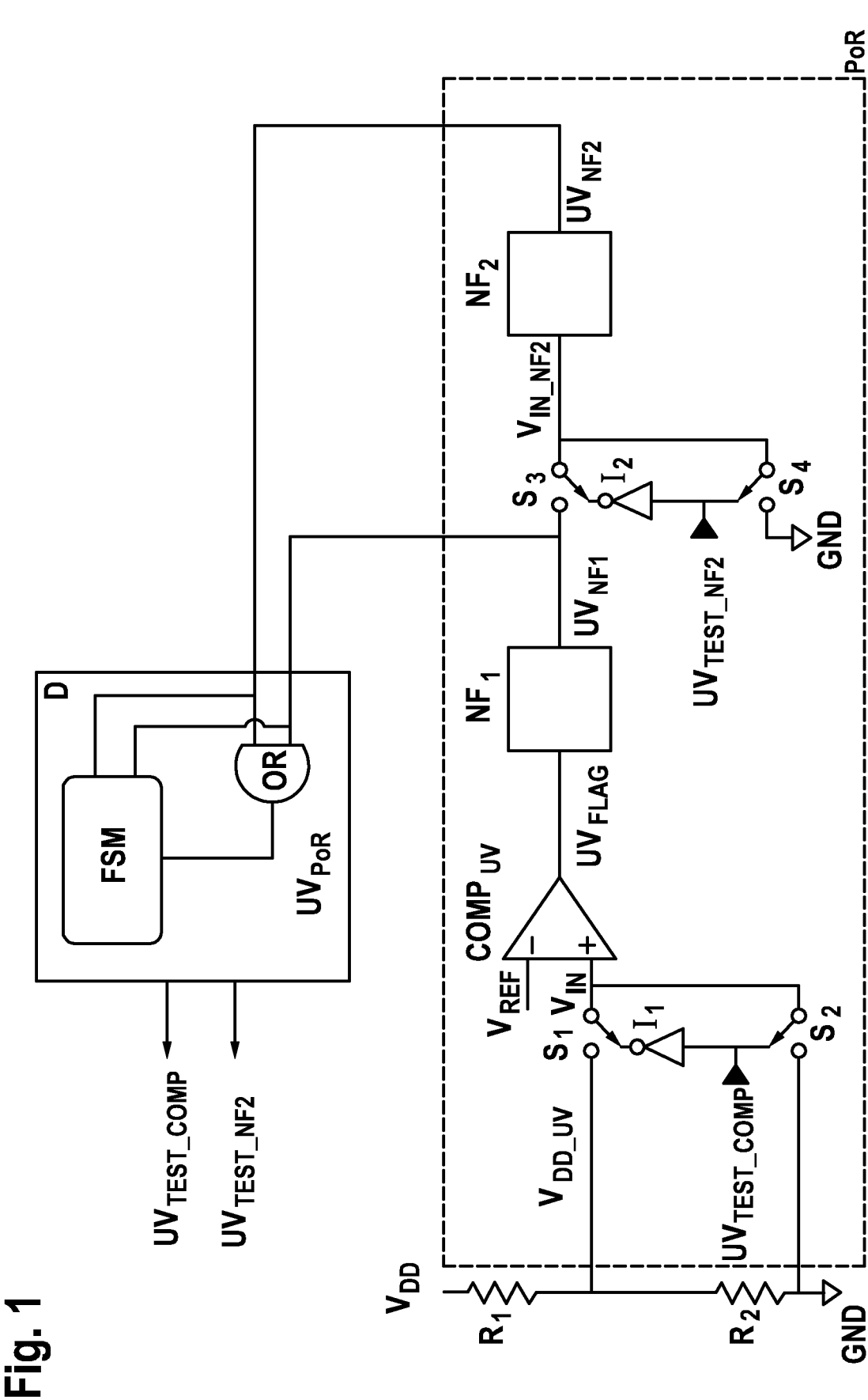
FIG. 1 shows an exemplary embodiment of a circuit according to the present invention for an error detection and for testing a power-on reset circuit.

FIG. 1 shows an exemplary embodiment of a circuit according to the present invention or a circuit for an error detection and for testing a power-on reset circuit PoR according to the present invention. Power-on reset circuit PoR is made up of an analog undervoltage comparator $COMP_{UV}$, which compares input voltage $V_{IN}$ with a known band gap reference voltage $V_{REF}$. Depending on whether input voltage $V_{IN}$ lies below or above reference voltage $V_{REF}$, the level at output $UV_{FLAG}$ of comparator $COMP_{UV}$ is set to low or high. A low level at output $UV_{FLAG}$ indicates that supply voltage $V_{DD}$ lies below the minimum level required for a proper function of digital part D and other load circuits. A high level at output $UV_{FLAG}$ means that supply voltage $V_{DD}$ lies above the minimum level required for a proper function of the circuits.

The level at output $UV_{FLAG}$ of comparator $COMP_{UV}$ is conveyed to a first filter $NF_1$ having a falling edge, which filters out the noise of the supply voltage for a definable time period T1. This means that first noise filter $NF_1$ changes its output state $UV_{NF1}$ from a high level to a low level only if comparator $COMP_{UV}$ detects an undervoltage of supply voltage $V_{DD}$ and keeps output $UV_{FLAG}$ at the low level for a minimum period of $T_1$. When output $UV_{FLAG}$ changes from a low level to a high level, noise filter $NF_1$ also immediately sets its output $UV_{NF1}$ to a high level, without any filter delay. Filter $_{NF1}$ is therefore applied only to the falling edge of $UV_{FLAG}$.

In addition, the output of filter $NF_1$ is conveyed to second filter $NF_2$ having a falling edge as input $V_{IN,NF2}$, which filters out the input noise for a time period of $T_2$. This means that second noise filter $NF_2$ changes its output state $UV_{NF2}$ from a high level to a low level only if its input $V_{IN,NF2}$ is kept at a low level for a minimum period of $T_2$. If $V_{IN,NF2}$ changes from a low level to a high level, noise filter $NF_2$ also immediately sets its output $UV_{NF2}$ to a high level. Filter $NF_2$ is thus applied only to a falling edge of $V_{IN,NF2}$. The two outputs $UV_{NF1}$ and $UV_{NF2}$ of the noise filters are then conveyed to digital part D, which generates the power-on reset signal $UV_{POR}$ by combining the two outputs using an OR gate. Both noise filters $NF_1$ and $NF_2$ are implemented using analog circuits.

Figure 2:
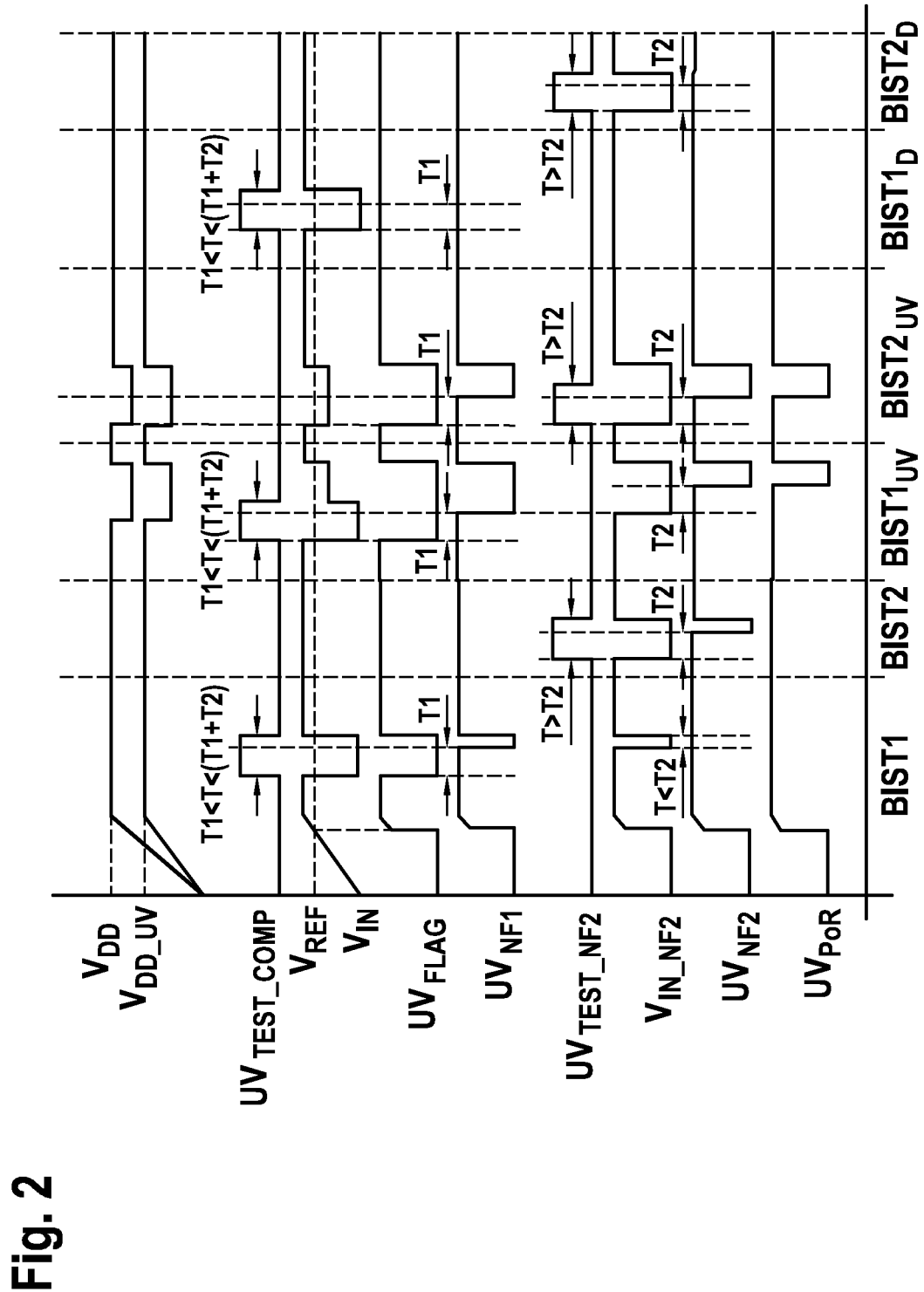
FIG. 2 shows signal characteristics of a power-on phase as well as a built-in self-test phase according to the circuit of the present invention.

FIG. 2 shows signal characteristics for a power-on phase as well as a built-in self-test phase (BIST phase) of an ASIC equipped with the circuit according to the present invention. During the startup of supply voltage $V_D$, shown on the left in FIG. 2, comparator $COMP_{UV}$ sets its output $UV_{FLAG}$ to a low level as long as voltage $V_{IN}$ applied at the input is smaller than the reference value of reference voltage $V_{REF}$. In the meantime, outputs $UV_{NF1}$ and $UV_{NF2}$ of noise filters $NF_1$ and $NF_2$ as well as power-on reset signal $UV_{POR}$ are set to a low level with the result that digital part D and the load circuits are set to the reset state.

As soon as input voltage $V_{IN}$ crosses reference voltage $V_{REF}$, the signal characteristics for the outputs $UV_{FLAG}$, $UV_{NF1}$, $UV_{NF2}$ and power-on reset signal $UV_{POR}$ reach a high level. The setting of output $UV_{POR}$ to a high level enables the reset or the reset signal, and digital part D is able to begin with the startup of the different load circuits and also with setting the ASIC to the normal operating mode.

In the event that input voltage $V_{IN}$ drops below reference value $V_{REF}$ for a time period $T>(T_1+T_2)$ during the normal operation of the ASIC, outputs $UV_{FLAG}$ followed by $UV_{NF1}$, $UV_{NF2}$ and $UV_{POR}$ are all set to a low level in order to indicate an undervoltage at $V_{DD}$. The setting of $UV_{POR}$ to a low level puts digital part D and the ASIC into the reset state. On the other hand, if an undervoltage exists in supply voltage $V_{DD}$ for a time period $T<=(T1+T2)$, then signal $UV_{POR}$ is not set to a low level because the brief undervoltage is filtered out by the combined filter time of the two noise filters $NF_1$ and $NF_2$ and the ASIC continues operating in the normal mode. As long as the power-on reset is inactive, that is to say, signal $UV_{POR}$ is at a high level, digital logic D is able to periodically perform a simple BIST during the normal operating mode in order to check whether the power-on reset circuit PoR is functioning properly. In addition, it can be verified in this way that no internal defects are present between the input and the output of the power-on reset circuit PoR.

Whether filter time period $T_1$ may be greater or smaller than filter time period $T_2$ is determined by the employed semiconductor technology and the design of power-on reset circuit PoR. Additional test signals are provided in order to test the functionality of the power-on reset circuit POR during the BIST phase by digital part D. Signal $UV_{TEST\_COMP}$ induces an undervoltage at input $V_{IN}$ of comparator $COMP_{UV}$ in order to set the value for $UV_{FLAG}$ in the BIST to a low level. In a similar manner, signal $UV_{TEST\_NF2}$ stimulates a low level input $V_{IN\_NF2}$ of filter $NF_2$ in order to set its output $UV_{NF2}$ to a low level in the BIST.

FIG. 2 furthermore shows the BIST, which is carried out in two phases and during which the functionality of comparator $COMP_{UV}$ and of noise filter $NF_1$ is tested to begin with. Next, the functionality of noise filter $NF_2$ is tested. On the left, FIG. 2 shows the signal characteristics during the BIST phases BIST1 and BIST2 in a normal operation without an undervoltage and/or defects in the circuit, followed by the BIST phases $BIST1_{UV}$ and $BIST2_{UV}$, illustrated in the center, during an undervoltage, and the BIST phases $BIST1_D$ and $BIST2_D$ shown on the right with a defect in the power-on reset circuit. The BIST phase begins as soon as both outputs $UV_{NF1}$ and $UV_{NF2}$ of noise filters $NF_1$ and $NF_2$ are at a high level.

In the first BIST phases BIST1, $BIST1_{UV}$, $BIST1_D$, the path from input $V_{IN}$ of comparator $COMP_{UV}$ to output $UV_{NF1}$ of first noise filter $NF_1$ is tested to check its functionality. This is done by setting signal $UV_{TEST\_COMP}$ to a high level for a time period $T_1 < T < (T_1 + T_2)$. Under this condition, undervoltage comparator $COMP_{UV}$ immediately sets it output $UV_{FLAG}$ to a low level. First noise filter $NF_1$ detects that its input is set to a low level and therefore filters the low input level for a time period of $T_1$. After a time $T_1$, noise filter $NF_1$ sets its output $UV_{NF1}$ to a low level. Digital part D actively monitors signal $UV_{NF1}$ for changes in its states. It detects the low output of the level and removes the pulse by setting output signal $UV_{TEST\_COMP}$ to a low level. When removing the pulse, undervoltage comparator $COMP_{UV}$ sets its output $UV_{FLAG}$ to a high level. First noise filter $NF_1$, which receives a high level at its input, also immediately sets its output $UV_{NF1}$ to a high level. As a result, the digital logic or digital part D expects a high output at output $UV_{NF1}$ in first BIST phase BIST1, followed by a low output and then followed by a high output, as illustrated on the left in FIG. 2.

If output $UV_{NF1}$ does not change its state on account of a defect in undervoltage comparator $COMP_{UV}$ or in first noise filter $NF_1$, as shown on the right in phase $BIST1_D$ of FIG. 2, then this is detected by digital logic D during the BIST phase, and corrective measures are able to be taken by initiating the deactivation of the ASIC, for instance.

If input $V_{IN}$ of comparator $COMP_{UV}$ is stimulated for a time period that is smaller than entire filter period $T_1 + T_2$ of the two noise filters $NF_1$ and $NF_2$, then the output of second noise filter $NF_2$ always retains a high output and does not change its state.

In second BIST phases BIST2, $BIST2_{UV}$, $BIST2_D$, the path from input $V_{IN-NF2}$ of second noise filter $NF_2$ to its output $UV_{NF2}$ is tested to check its functionality. This is done by setting signal $UV_{TEST\_NF2}$ to a high level for a time period $T > T_2$. Under this condition, second noise filter $NF_2$ detects that its input level is low and therefore filters the low input level for a time period of $T_2$. After a time $T_2$, noise filter $NF_2$ sets its output $UV_{NF2}$ to a low level. Digital logic D actively monitors signal $UV_{NF2}$ for changes in its states. It detects the low output level and removes the pulse by setting $UV_{TEST\_NF2}$ to a low level. When removing the pulse, second noise filter $NF_2$, which samples a high signal level at its input, also immediately sets its output $UV_{NF1}$ to a high level. Digital logic D therefore expects a high level at output $UV_{NF2}$ in the second BIST phase, followed by a low level and then followed by a high level, as illustrated in the phase BIST2 on the left in FIG. 2. If output $UV_{NF2}$ does not change its state because of an existing defect in second noise filter $NF_2$, as illustrated in phase $BIST2_D$ on the right in FIG. 2, then this is detected by digital part D during the second BIST phase so that corrective measures are able to be taken such as the deactivation of the ASIC.

While a pulse is present at filter input $V_{IN\_NF2}$ of filter $NF_2$, output $UV_{NF1}$ of first noise filter $NF_1$ is unaffected and consequently always retains a high output level without changing its state. Since the power-on reset signal is generated by the two outputs $UV_{NF1}$ and $UV_{NF2}$ of noise filters $NF_1$ and $NF_2$ and at least one of the noise filter outputs always has a high level in both BIST phases BIST1 and BIST2, the ASIC continues to operate in the normal way without transitioning to the reset state. In the two BIST phases, the entire path from the input to the output of the power-on reset circuit PoR is tested to check its functionality and the presence of any defects. An additional advantage of the described procedure is that in the event of a defect in digital part D, which causes the BIST pulse to be applied for a longer period than the one described above, the worst reaction that may occur is the output of a power-on reset signal, which sets the ASIC and the digital part to the reset state. The advantage of the circuit according to the present invention is that it continues to operate in the normal manner even during the BIST phase. This manifests itself in the way in which BIST signals are applied and removed. Since the entire stimulation of the BIST signals $UV_{TEST\_COMP}$ and $UV_{TEST\_NF2}$ takes place within a period that is smaller than filter time $T1 + T2$ of the power-on reset circuit PoR, power-on reset signal $UV_{POR}$ does not change its state. The $UV_{POR}$ signal changes its state from a high to a low state during the BIST phase only if an undervoltage is already present or if it occurs in parallel with the BIST pulse. This means that comparator $COMP_{UV}$ remains at a low level at its output $UV_{FLAG}$ even after pulse $UV_{TEST\_COMP}$ has been removed.

If, for instance, as shown in the center under $BIST1_{UV}$ in FIG. 2, input voltage $V_{IN}$ drops below reference voltage $V_{REF}$ during the first BIST phase, $UV_{FLAG}$ and thus also $UV_{NF1}$ keep their states at a low level even after pulse $UV_{TEST\_COMP}$ has been removed. If the undervoltage event exists in such a way that second noise filter input $V_{IN\_NF2}$ of filter $NF_2$ is kept at a low value for a period that is greater than $T_2$, then second noise filter output $UV_{NF2}$ and finally also the power-on reset signal $UV_{POR}$ are likewise set to a low level. Digital part D then assumes the reset state.

In a similar manner, if input voltage $V_{IN}$ drops below reference voltage $V_{REF}$ in the second BIST phase, as shown in the center under $BIST2_{UV}$ in FIG. 2, output $UV_{NF1}$ of first noise filter $NF_1$ is adjusted from a high to a low level after a period of $T_1$. When pulse $UV_{TEST\_NF2}$ is removed, second noise filter $NF_2$ continues to detect a low level at its input and thus retains a low level at its output $UV_{NF2}$. Depending on whether the undervoltage event is present before or after the start of the second BIST phase, the power-on reset signal $UV_{POR}$ is adjusted to low after a minimum time of $T_1$. It is therefore understood that the BIST for the power-on reset circuit PoR does not interfere with the normal operation because power-on reset circuit PoR is able to trigger a reset as long as the undervoltage event in supply voltage $V_{DD}$ lasts for at least $T > (T1 + T2)$ in the first BIST phase or during a normal operation, and for at least $T > T1$ in the second BIST phase.

Figure 3:
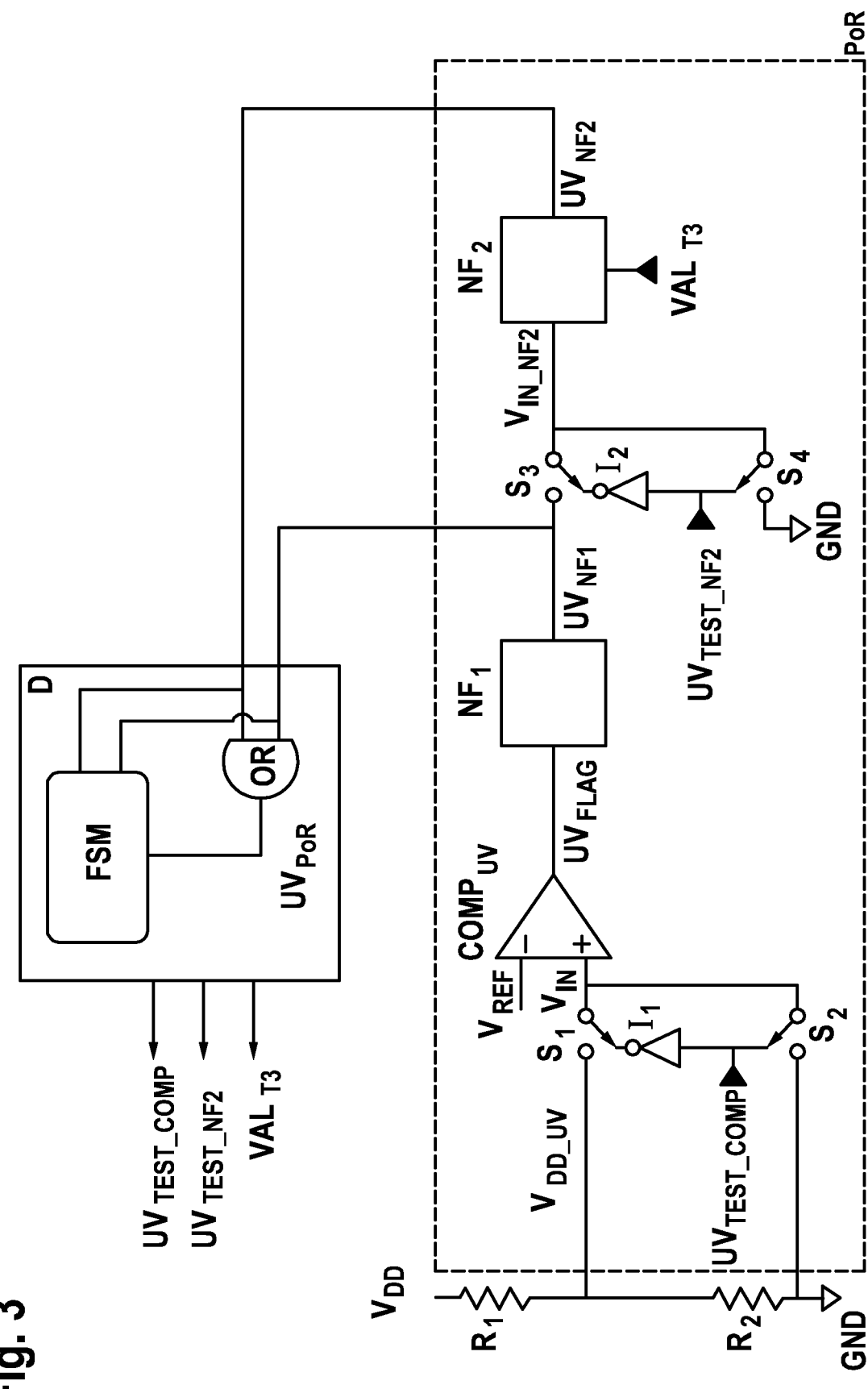
FIG. 3 shows a further exemplary embodiment of a circuit according to the present invention for an error detection and for testing a power-on reset circuit.

FIG. 3 shows an alternative embodiment of the present invention according to an exemplary embodiment, in which the circuit includes a configurable filter time for second noise filter $NF_2$ for applications in which filter period $T_1 + T_2$ of the power-on reset signal has to be very small. In such a configurable mode, the noise filter period of second noise filter $NF_2$ is able to be increased from $T_2$ to $T_3$, where $T_3 > T_2$ during the first BIST phase. As a result, power-on reset signal $UV_{POR}$ is set to a low level during the first BIST phase only if an undervoltage is present for a time greater than $T_1 + T_3$. In addition, power-on reset signal $UV_{POR}$ is set to a low level during the normal mode only if the undervoltage event exists for a period of $T_1 + T_2$, where $(T_1 + T_2) < (T_1 + T_3)$. Depending on the circuit configuration, first noise filter $NF_1$ may be integrated into undervoltage comparator $COMP_{UV}$.

What is claimed is:

1. An electric circuit for testing a power-on reset circuit, comprising:
   a comparator to detect an undervoltage for an input voltage by comparing the input voltage to a reference voltage, and to output an output signal, wherein the power-on reset circuit includes the comparator;
   a first noise filter to filter out noise from the output signal received as a first input signal for a first time period and to output a first filtered output signal;

a second noise filter to filter out noise from a second input signal for a second time period and to output a second filtered output signal;
a digital part including an OR gate for a logical linkage of the first filtered output signal and the second filtered output signal for an output of a power-on reset signal; and
a circuit to supply a test signal for the comparator or the second noise filter;
wherein the digital part periodically performs a built-in self-test (BIST) during a normal operating mode to test whether the power-on reset circuit is functioning properly, so long as the power-on reset is inactive.

2. The electric circuit as recited in claim 1, wherein test signal is provided as the input voltage at the comparator.

3. The electric circuit as recited in claim 1, wherein the first filtered output signal or a test signal is provided as an input signal at the second noise filter.

4. The electric circuit as recited in claim 1, wherein an analog circuit is provided as the first noise filter and/or as the second noise filter.

5. The electric circuit as recited in claim 1, wherein the comparator and the first noise filter are jointly provided in a component of the electric circuit.

6. The electric circuit as recited in claim 1, wherein the second noise filter is configured to take a configurable filter time into account.

7. The electric circuit as recited in claim 6, wherein the second noise filter has an input for receiving a value for the configurable filter time.

8. The electric circuit as recited in claim 7, wherein the digital part is configured to supply the value for the configurable filter time.

9. The electric circuit as recited in claim 1, wherein the circuit is configured to supply the test signal for the comparator.

10. The electric circuit as recited in claim 1, wherein the circuit is configured to supply the test signal for the second noise filter.

11. The electric circuit as recited in claim 1, wherein the digital part is configured to supply test signals.

12. The electric circuit as recited in claim 1, further comprising:
a voltage splitter to supply an adapted supply voltage from a supply voltage.

* * * * *